United States Patent
Conta et al.

(10) Patent No.: US 7,255,799 B2
(45) Date of Patent: Aug. 14, 2007

(54) METHOD FOR SELECTIVELY COVERING A MICRO MACHINED SURFACE

(75) Inventors: Renato Conta, Ivrea (IT); Irma Disegna, Rondissone (IT)

(73) Assignee: Telecom Italia S.p.A, Milan (IT)

( * ) Notice: Subject to any disclaimer, the term of this patent is extended or adjusted under 35 U.S.C. 154(b) by 120 days.

(21) Appl. No.: 10/527,670

(22) PCT Filed: Sep. 11, 2003

(86) PCT No.: PCT/IT03/00545

§ 371 (c)(1),
(2), (4) Date: Mar. 11, 2005

(87) PCT Pub. No.: WO2004/025726

PCT Pub. Date: Mar. 25, 2004

(65) Prior Publication Data

US 2005/0224453 A1 Oct. 13, 2005

(30) Foreign Application Priority Data

Sep. 12, 2002 (IT) .......................... TO2002A0793

(51) Int. Cl.
 *B44C 1/22* (2006.01)
 *H01L 21/00* (2006.01)
(52) U.S. Cl. .............................. 216/2; 216/41; 216/47; 216/24; 430/313; 438/706; 438/710

(58) Field of Classification Search .................... 216/2, 216/24, 41, 47; 438/706, 710; 430/313
See application file for complete search history.

(56) References Cited

U.S. PATENT DOCUMENTS 5,091,288 A    2/1992   Zappella et al.
5,888,845 A  * 3/1999   Bashir et al. ................. 438/53

FOREIGN PATENT DOCUMENTS

| JP | 61 142761 A |   | 6/1986 |
| JP | 62195146    | * | 8/1987 |
| JP | 10 168557 A |   | 6/1998 |
| WO | WO 00/16105 A |  | 3/2000 |

OTHER PUBLICATIONS

Patent Abstracts of Japan, vol. 010, No. 340 (E-455), Nov. 18, 1986.
Patent Abstracts of Japan, vol. 1998, No. 11, Sep. 30, 1998.

* cited by examiner

*Primary Examiner*—Shamim Ahmed
(74) *Attorney, Agent, or Firm*—Venable LLP; Robert Kinberg; Steven J. Schwarz

(57) ABSTRACT

On a die that has etchings on a surface, firstly a sheet of negative photoresist is laid down which, by means of an exposure and subsequent development, is left only above the etchings; then, upon the negative photoresist, a positive photoresist is applied, which is subjected to exposure and development to produce functional geometries deposited in thin film; subsequently the positive photoresist is removed in a "lift-off" operation, and the negative photoresist is taken off in a plasma operation, thus revealing the etchings.

20 Claims, 11 Drawing Sheets

METHOD FOR SELECTIVELY COVERING A MICRO MACHINED SURFACE

This application is a National Stage application of co-pending PCT application PCT/IT2003/000545 filed 11 Sep. 2003, which was published in the English language under PCT Article 21(2) on 25 Mar. 2004, and claims the benefit of Italian application number TO2002A00793 filed 12 Sep. 2002. The disclosures of each are expressly incorporated herein.

TECHNICAL FIELD

This invention relates to the mems 3D technology (mems: Micro Electro-Mechanical System), or the moems 3D technology (moems: Micro Optical Electro-Mechanical System), and more precisely related to a method for uniformly laying a photoresist on a die having an irregular surface, for example on account of its having etchings or recesses.

BACKGROUND ART

Depicted in FIG. 1, as a non-restrictive example of application of the moems technology, is an axonometric illustration of an optoelectronic device 10, integrated on a die 51 which, by way of non-restrictive example, may be of a semiconductor material, generally silicon. On the upper face 11 of the die 51, etchings 12, needed for instance for the seating of optical fibres, are made. Also on this upper face 11, there are outer pads 52 to which optoelectronic components 53 have been soldered, and inner pads 54 needed for connecting the optoelectronic device to an external circuit not shown in the figures.

Still in FIG. 1, the x, y and z axes which give the three-dimensional references of the die 51 are defined.

The process for manufacturing the optoelectronic device will now be described according to a technique known as "lift-off" to those acquainted with the sector art, by means of which geometries having different layers can be produced directly on non-reactive materials, such as for example titanium, platinum, gold, or with which soldering alloys (for example gold/tin 80/20) may be deposited selectively, or non-metallic materials may be deposited selectively. Reference should be made to the flow diagram of FIG. 2, for only the steps necessary for the understanding of this invention.

In a first step 70, a wafer 66 is made available on which the dice 51 are made (FIG. 3).

In a step 71, illustrated with the aid of FIG. 4, on the dice 51 a layer 61 is spread of "lift off resist", for instance of the LOR® series by Micro-Chem, having for example a thickness of between 0.5 and 6 □m, as indicated in the cross-section detail of FIG. 4 which concerns an area without etchings. The lift off resist is usually applied in the fluid state, by means for instance of a centrifuge in a process known as "spinner coating".

In a step 72, on the lift off resist 61, a layer 60 of conventional type positive photoresist is laid, having for example a thickness of between 0.5 and 20 □m, as also indicated in FIG. 4. The positive photoresist is also usually applied in the fluid state, by means for instance of spinner coating.

Designated with number 14 is the upper face of the layer 60 of photoresist, substantially parallel to the face 11 and to the x, y axes.

The photoresist is defined as "positive" if, starting from an initially insoluble state in its development solvent, it depolymerizes due to the effect of radiation, for example ultraviolet, becoming soluble.

The technology described, which uses the layer 61 of lift off resist and the layer 60 of conventional positive photoresist, is called "bilayer".

In a step 74 (FIG. 5), exposure of the photoresist is performed to ultraviolet (UV) radiation by means of a mask 13 provided with windows 122. The photoresist, being positive, depolymerizes in the zones 26 corresponding to the windows 122, and therefore struck by the radiation UV, whereas it remains insoluble in those zones that are kept in the shade by the opaque areas of the mask.

In a subsequent step 75 the layer of photoresist 60 is developed according to known techniques which, by means of a solvent, remove the photoresist only in the zones 26 depolymerized by ultraviolet (UV) radiation through the windows 122: thus cavities 64 are made, bounded by edges 25 (FIG. 6).

The same solvent dissolves the underlying lift off resist 61 to a greater extent than the photoresist 60, thereby producing sub-etchings 22, the depth of which depends on the development time.

A first alternative exists, illustrated in FIG. 7, according to which only the monolayer layer of photoresist 60 is produced. After development, the cavities 64' in this case are bound off by walls 15.

On account of diffraction and reflection phenomena in the UV radiation, the depolymerization of the layer of photoresist 60 takes place, parallel to the plane x-y, to a greater extent in the vicinity of the face 11 of the die, and to a lesser extent in the vicinity of the surface 14 of the photoresist: the walls 15 are not therefore parallel to the z axis, but instead have an undercut $\beta$, positive according to the sign convention indicated in FIG. 7. This technology is called "monolayer", and is less expensive but also controllable with much less precision than bilayer.

There is also a second monolayer alternative, again illustrated with the aid of FIG. 7, according to which only the layer of photoresist 60 is produced, which is then treated with a surface modifier, for instance toluene, which renders the upper surface 14 more resistant to the solvent: in this way, after development, in the same photoresist 60, walls 15 with sub-etching or with a more pronounced positive undercut $\beta$ are produced. Costs and controllability of this second alternative lie between those of the first monolayer alternative and those of the bilayer technology.

In a step 76 a vacuum deposit is made, for instance of a metal, on the surface 14, in which the latter remains intact, and on the face 11 where this is uncovered through the effect of the development described in step 75. The deposit takes the form, for example, of a "sputtering" or "electron beam" process, both of which are known, the result of which is a subassembly 23, illustrated in FIG. 8, comprising a first deposited layer (52, 54) adherent to the face 11, which assumes the geometry of the cavities 64 and effectively constitutes the outer pads 52 and the inner pads 54, and a second deposited layer 16 adherent to the surface 14. No layer is deposited on the sub-etchings 22.

Even when the monolayer technology is adopted, no layer is deposited on the walls 15, thanks to the positive undercut $\beta$ and to the sub-etchings, if any.

This separation between the two deposited layers is essential for subsequent operations, and is a first fundamental reason for choosing positive photoresist to produce the layer 60, as there is in fact no practical possibility of producing a bilayer with negative photoresist, whereas, if a monolayer with negative photoresist is chosen, the undercut β would be negative according to the sign convention adopted, and the walls of the cavity would be covered over by the deposit.

The deposited layers 52, 54 and 16 may be metallic, or made of non-metallic materials, such as for example oxides, nitrides, carbides and the like.

If the deposited layers 52, 54 and 16 are made of metals, these may be non-reactive type, such as for instance titanium, gold or platinum, for the outer pads 52 or the inner pads 54, or a gold/tin 80/20 alloy for the soldering. These alloys are generally deposited, according to a known technology, in alternate layers of the component metals: the various layers are produced in appropriate ratios between the thicknesses to give the alloy—generally eutectic—the right composition, and can have an overall thickness, for instance, up to 5 μm.

In a step 77, illustrated with the aid of FIG. 9, the layer 60 of positive photoresist and the layer 61 of lift off resist are removed by means of a process known as "lift off" to those acquainted with the sector art. The subassembly 23 is plunged into a solvent 26, for instance acetone which, through the edges 25 and the sub-etchings 22, free of the deposited layer, penetrates through the layers 60 and 61, and dissolves them, as indicated by the arrows 21, eliminating them completely and freeing the second deposited layer 16, which is then cast aside.

The operation is facilitated by a mechanical action such as, for instance, an ultrasound wash, and can only be conducted on a positive photoresist: this is a second fundamental reason why positive photoresist is chosen for the layer 60. If, on the other hand, a negative photoresist were to be chosen, it would not be possible to perform the lift off operation with today's technologies.

Where the monolayer technology is selected, this step 77 is performed in the same way, since the solvent can penetrate through the walls 15, also free of the deposited layer.

At the end of the step 77 the subassembly 23 is finished, as shown in FIG. 10, where a die 51, an outer pad 52 and an inner pad 54 may be seen.

This process, however, has a number of technical problems that will now be described.

When etchings 12 are made on a face of the die 51, as indicated in the section view of FIG. 11, a few tenths or hundredths of a μm thick for instance and needed typically in moems applications for seating optical fibres, the layers 60 and 61 are distributed unevenly on account of the etchings 12.

This produces an insufficient definition of the figure to be removed during the exposure and development, which makes the process practically impossible to use.

In particular, the etching 12 may reach a depth D of a few hundredths of a μm. Furthermore, if the die 51 is made of silicon, the etching 12 is often obtained by way of a chemical reaction which advances according to the crystallographic axes of the silicon, forming two walls 20 which produce an angle α=54.7° with respect to the x axis: the width W of the etching is therefore:

$$W = 2\,D/\tan\alpha$$

If, for example, the etching concerns roughly one half of the thickness of a wafer of 625 μm, it reaches a depth D of about 300 μm; in this case, W=425 μm, a width that makes the above-mentioned unevenness extremely serious.

Moreover, choice of the positive photoresist is dictated by the first and second reasons already illustrated, and the layer of positive photoresist is normally applied in the liquid state: this favours unevenness of the deposition local to the etchings.

A second technical problem also exists: in some subassemblies, such as for instance those made in the moems technology, etchings 12 must be made on the same face as that containing other films. If the etching is made after the films are deposited, it is necessary to protect the films during the chemical reaction on the silicon, which is highly aggressive as it uses KOH or TMAH for numerous hours at a temperature of roughly 80° C., as is known to those acquainted with the sector art.

It is therefore advantageous to make the etchings in the silicon at the start of the process, for instance through a known process with a mask of SiO2, and to deposit and define the films at a later time, but in this way the first of the problems outlined crops up again.

DISCLOSURE OF THE INVENTION

The object of this invention is that of selectively depositing a layer on a die that has an irregular surface, in particular on account of etchings, according to a predefined geometry.

Another object is that of selectively depositing the components of a soldering alloy in alternating layers.

A further object is to maintain the etchings clear and clean throughout the entire die manufacturing process.

Yet another object is that of depositing a layer of positive photoresist on a die that has an irregular surface, in particular on account of etchings, in a layer of uniform thickness.

The above objects are achieved by means of a method for selectively covering a micro machined surface, characterized as defined in the main claims.

These and other objects, characteristics and advantages of the invention shall become apparent from the following description of a preferred embodiment, provided as a non-restrictive example, and with reference to the accompanying drawings in which.

DESCRIPTION OF THE PREFERED EMBODIMENT

Figure 1:
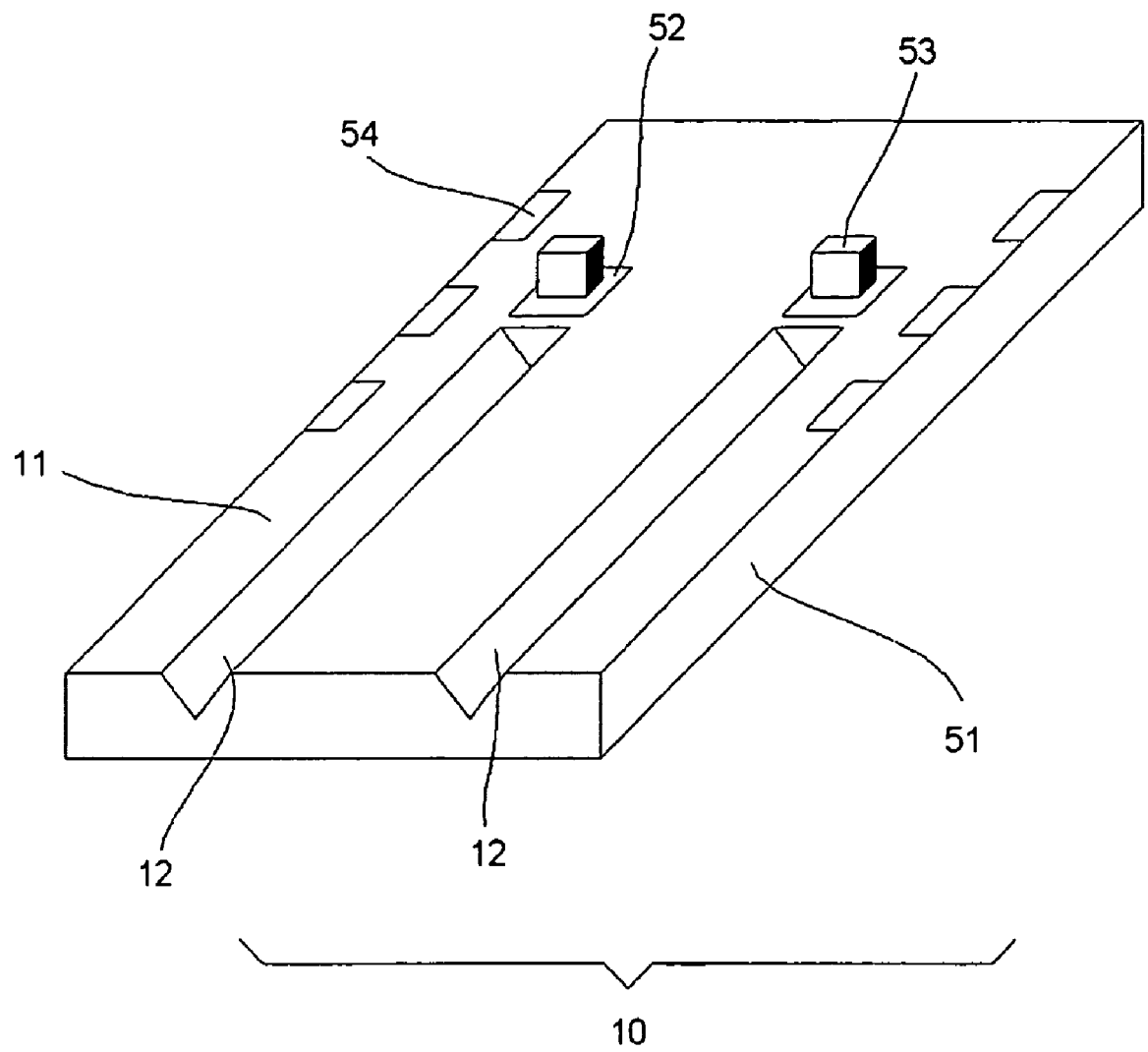
FIG. 1 represents an axonometric view of an optoelectronic device.
Figure 2:
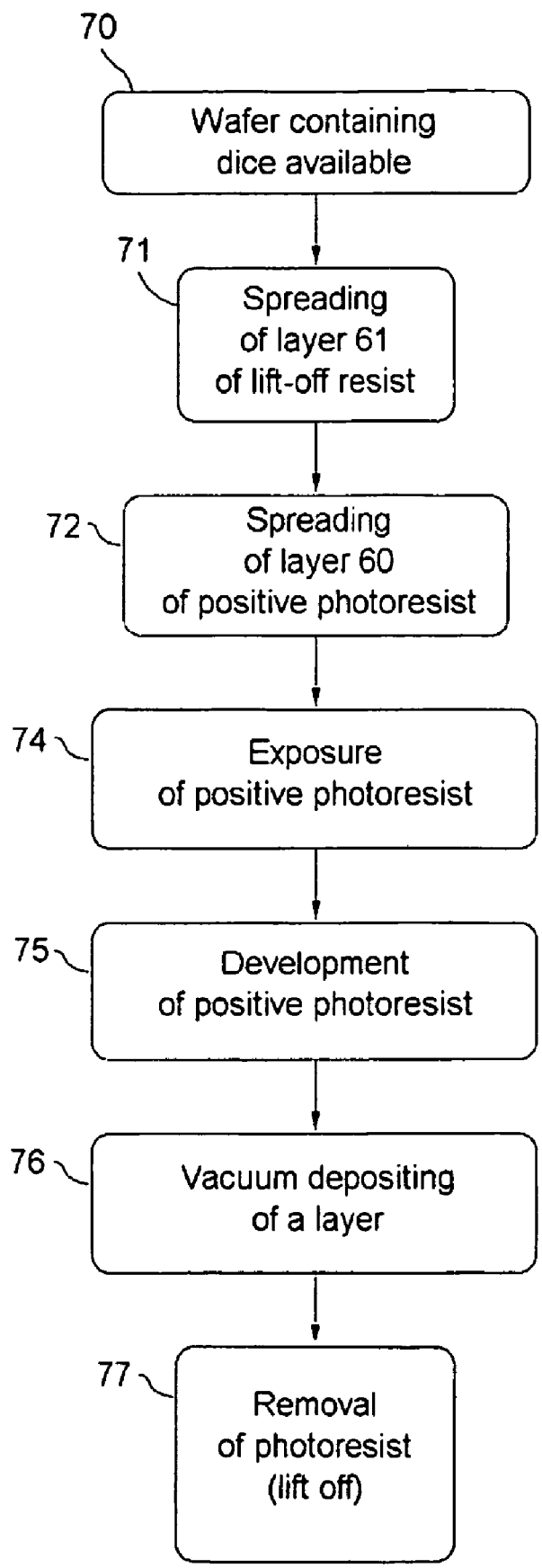
FIG. 2 illustrates the flow of one part of the manufacturing process of the optoelectronic device of FIG. 1, according to the known art.
Figure 3:
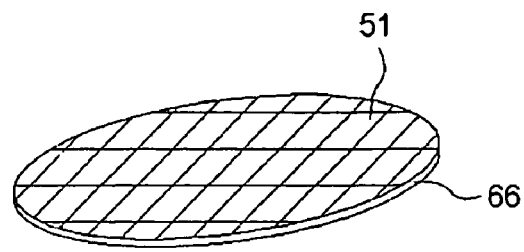
FIG. 3 represents a wafer of semiconductor material, containing dice that have not as yet been separated.
Figure 4:
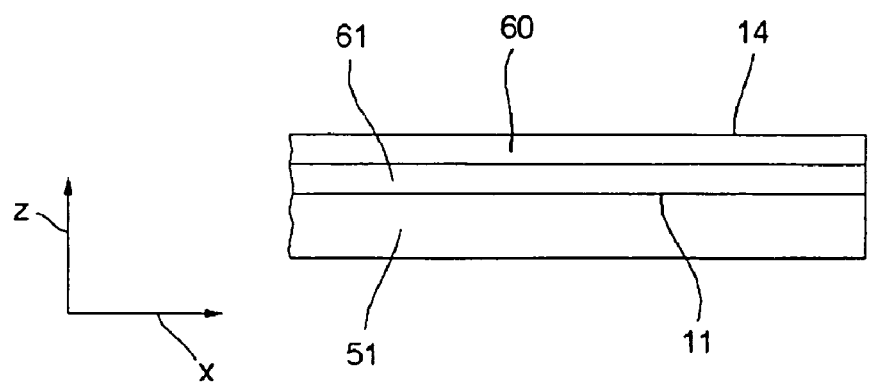
FIG. 4 represents a section view of a die without etchings, bearing a layer of lift off resist and one of positive photoresist.
Figure 5:
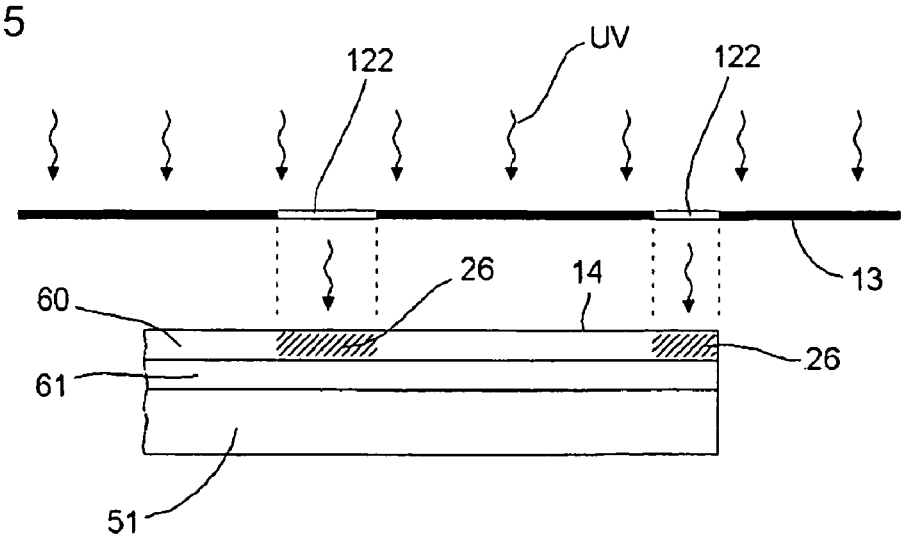
FIG. 5 represents the exposure of the layer of positive photoresist on the die.
Figure 6:
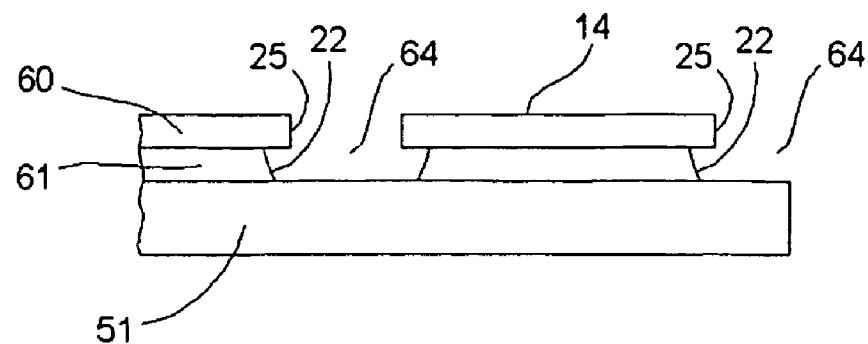
FIG. 6 represents the development of the same layer of photoresist.
Figure 7:
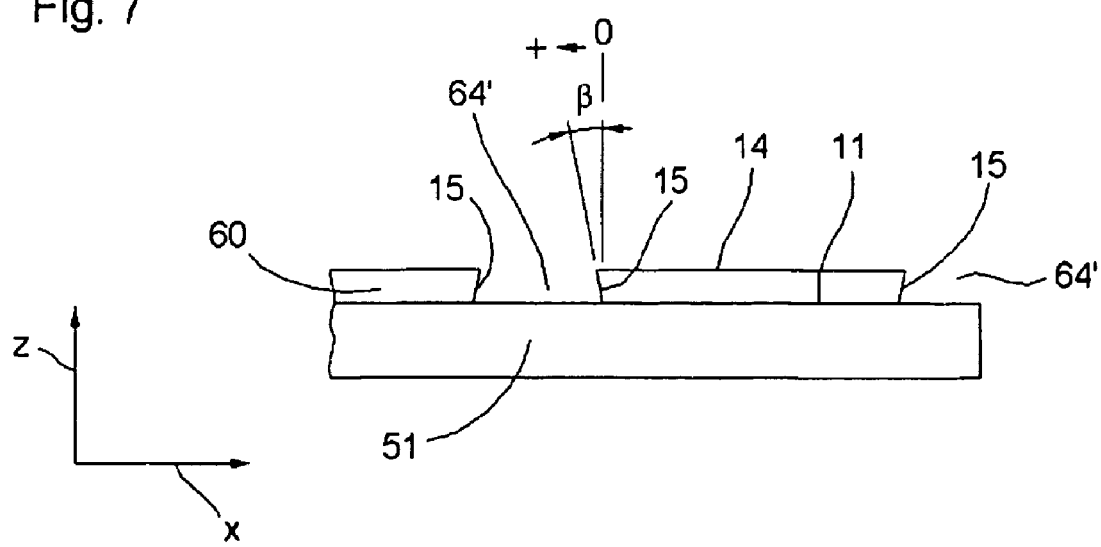
FIG. 7 represents the development of the layer of photoresist in the monolayer technology.
Figure 8:
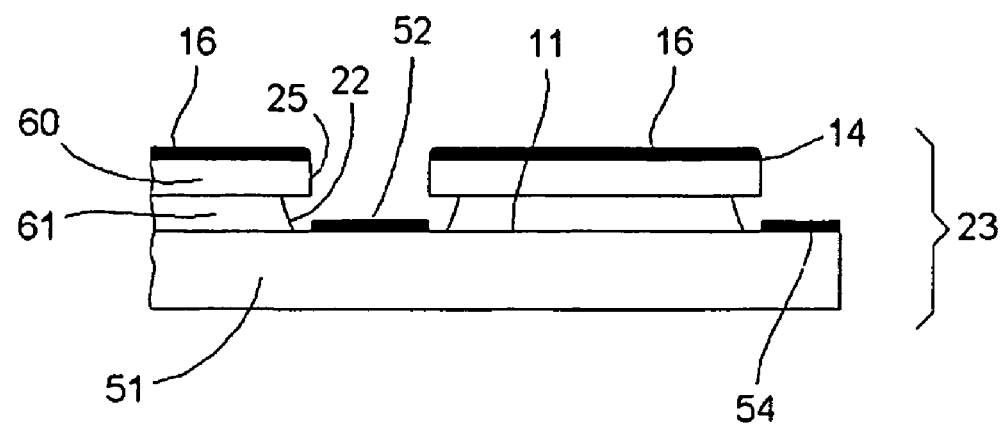
FIG. 8 represents a deposited layer on the layer of photoresist and in the cavities.
Figure 9:
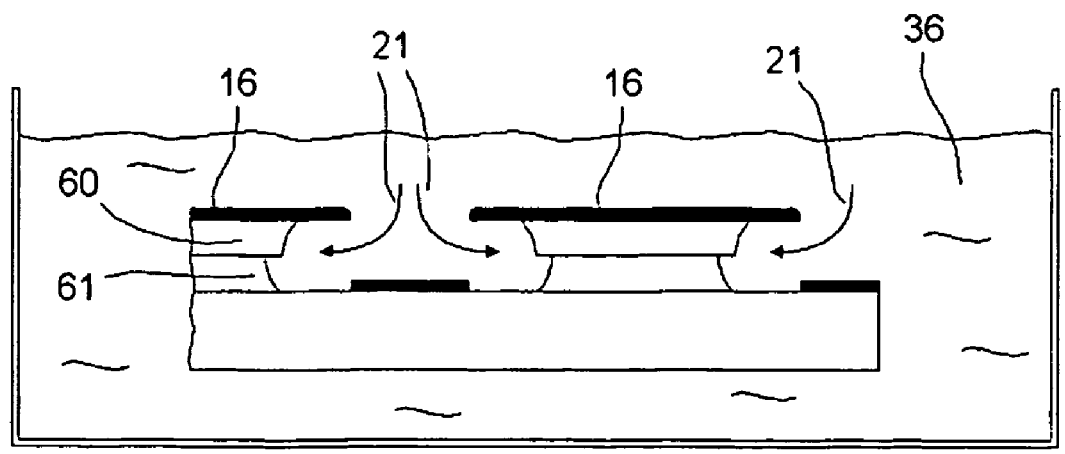
FIG. 9 represents the lift off of the layer of photoresist.
Figure 10:
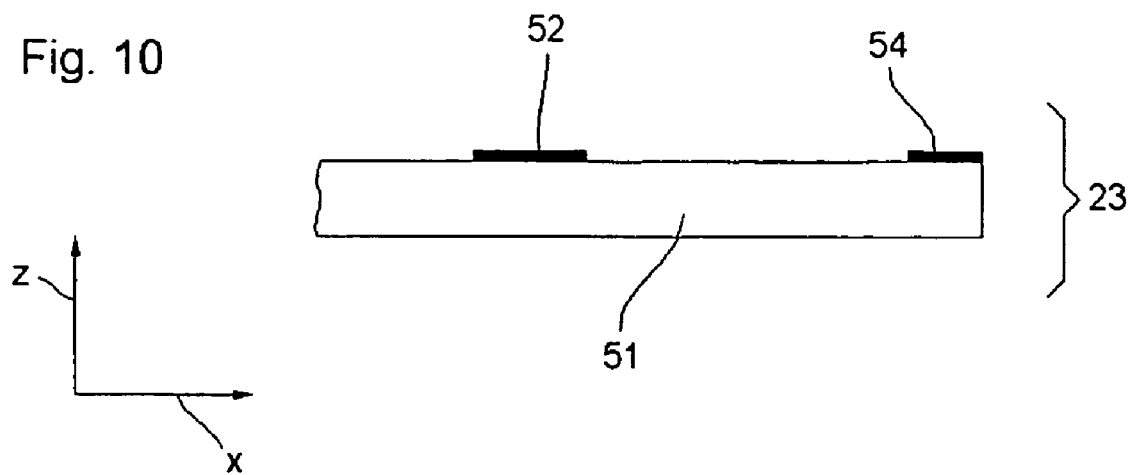
FIG. 10 represents the subassembly at the end of the process described.
Figure 11:
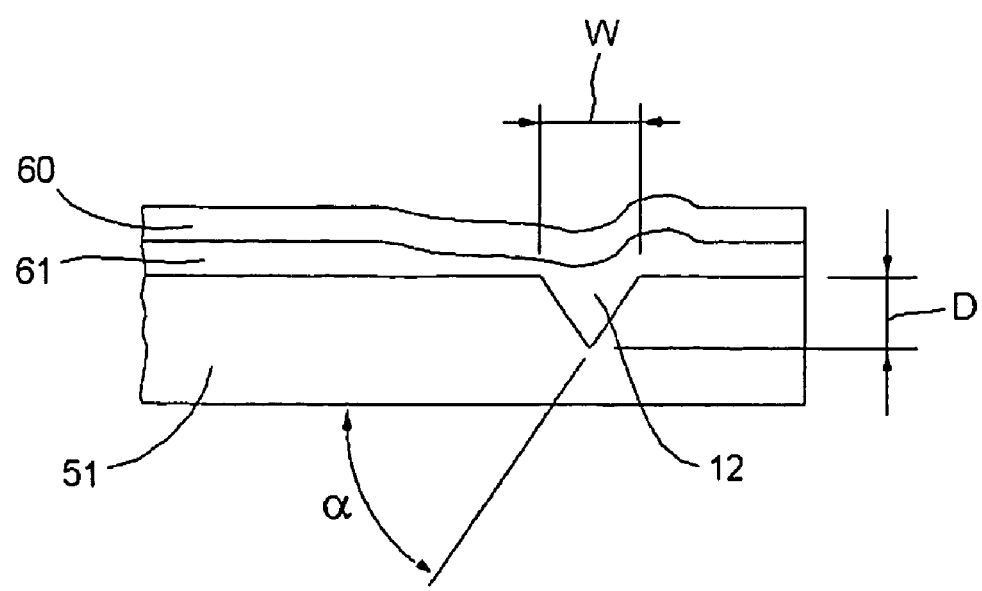
FIG. 11 represents a section view of a die provided with an etching, and bearing a layer of lift off resist and a layer of positive photoresist, according to the known art.
Figure 12:
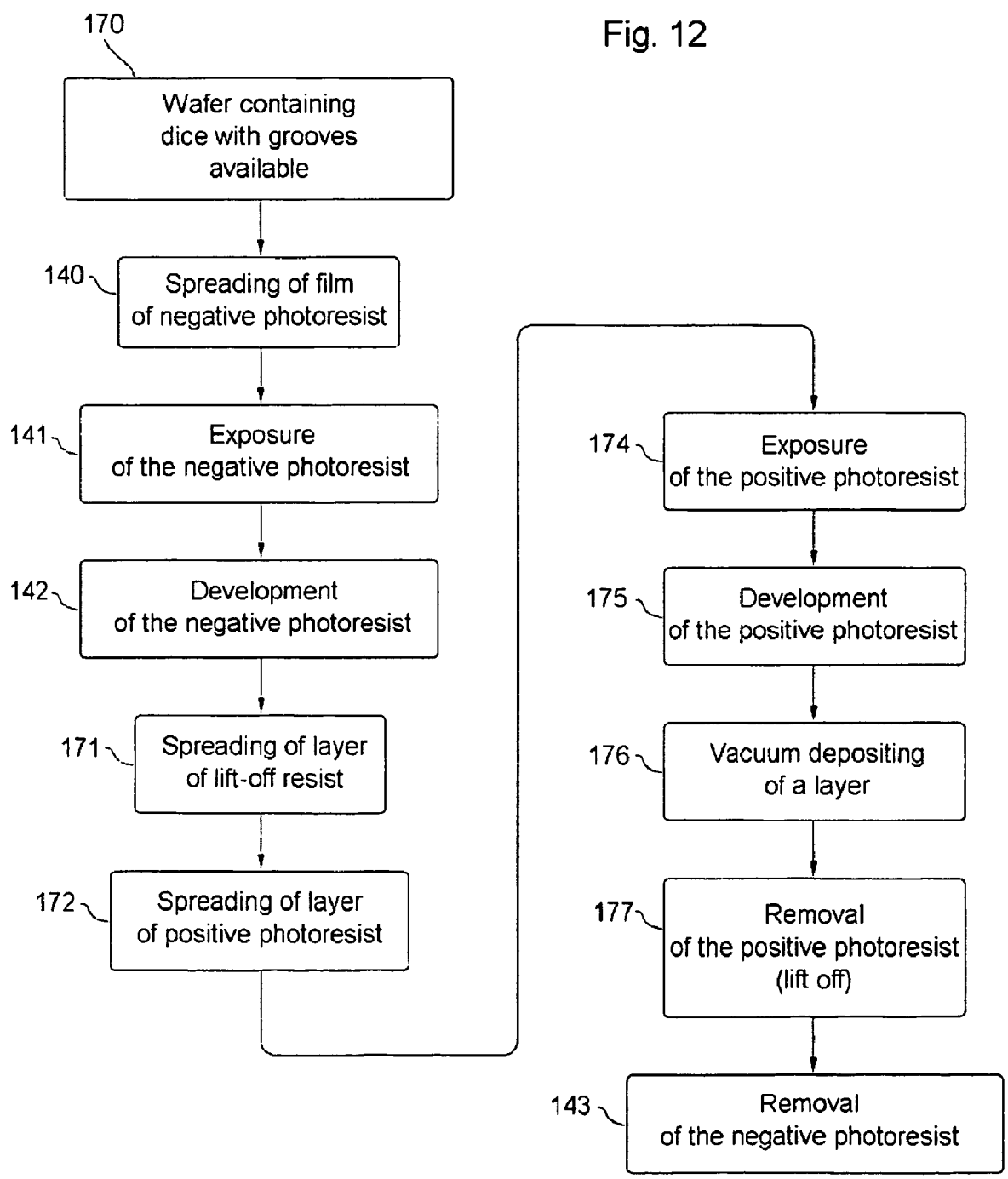
FIG. 12 illustrates the flow of the manufacturing process of the optoelectronic device with etchings, according to the invention.

The manufacturing process of the optoelectronic device according to this invention is now described, with reference to the flow diagram of FIG. 12, limited to those steps needed for understanding of the invention.

Figure 13:
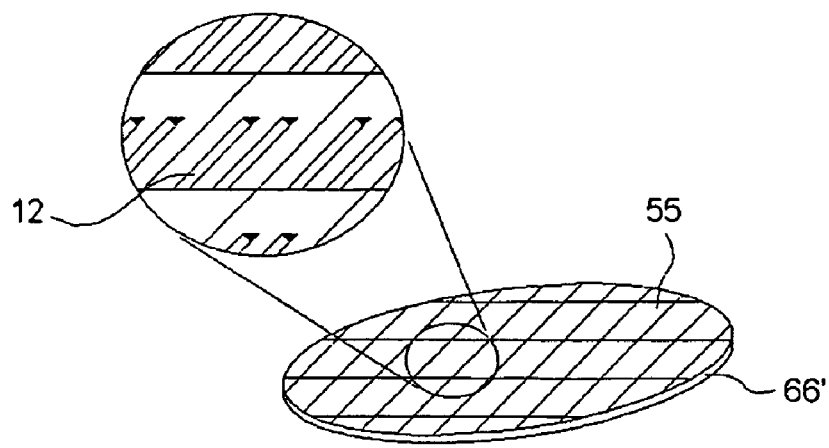
FIG. 13 represents a wafer of semiconductor material, containing dice with etchings.

In a step 170 a wafer 66' is made available, containing dice 55 (FIG. 13) which have etchings 12, as illustrated in the enlarged portion of the same FIG. 13. In the description, it is assumed, as a non-restrictive example, that the die 55 is of silicon, though the same die could also be made of other materials, such as for instance glass, ceramic or other insulating materials, or of GaAs or other semiconducting materials, or of metals.

Figure 14:
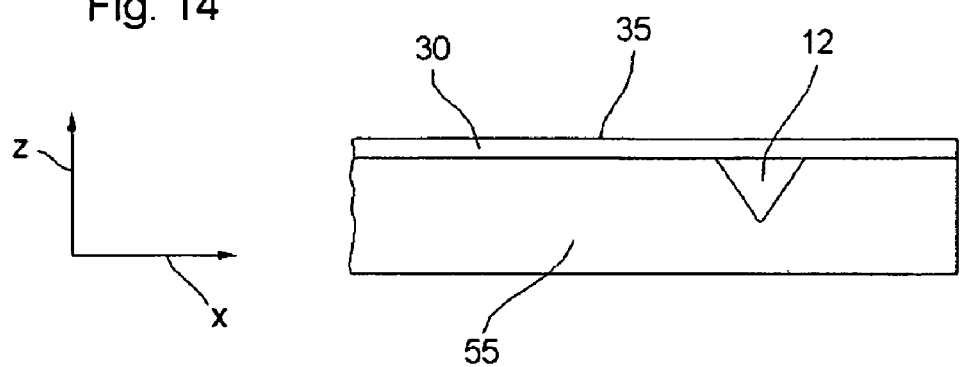
FIG. 14 represents a section view of a die with an etching, and bearing a film of negative photoresist.

In a step 140, a film 30 of negative photoresist is spread on the die 55, as seen in section view in the FIG. 14. Thickness of the film 30 is, for example, between 5 and 30 μm, and it is sufficiently rigid to cover the etching 12 without settling on it. The etching 12 is in this way protected, and at the same time remains clean as it has no contact with the photoresist. The upper surface of the film 30 is designated by means of the numeral 35.

The photoresist is called "negative" if, starting from a state soluble in one of its development solvent, it polymerizes through the effect of radiation, for example ultraviolet, becoming insoluble.

Figure 15:
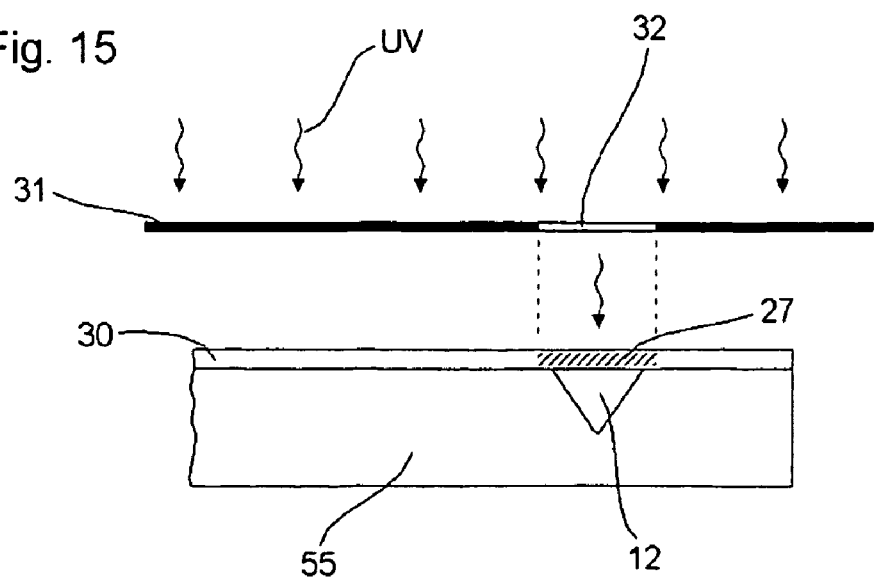
FIG. 15 represents the exposure of the film of negative photoresist.

In a step 141, (FIG. 15), exposure is performed of the film 30 of negative photoresist to ultraviolet (UV) radiation by means of a first mask 31 fitted with a window 32. The window 32 extends above the etching 12 and above a margin around this, a few tenths of a μm wide for instance. The photoresist, being negative, polymerizes in a zone 27 corresponding to the window 32, and therefore struck by the UV radiation, whereas it remains depolymerized in the zones held in the shade by the opaque portions of the mask 31.

Figure 16:
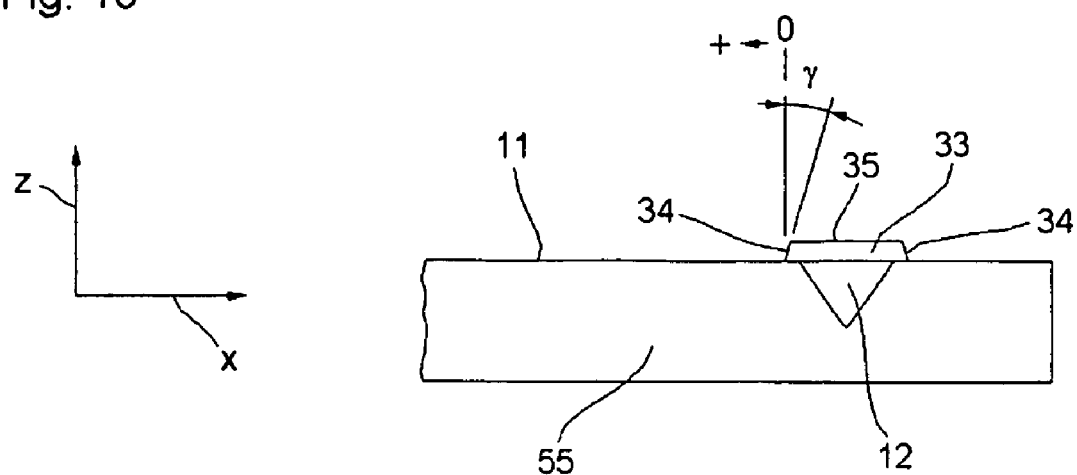
FIG. 16 represents the development of the film of negative photoresist.

In a later step 142, development is performed of the film 30 of negative photoresist according to known techniques which, by means of a solvent, remove the film only in the zones that were depolymerized (FIG. 16): in correspondence with the zone 27, a covering 33 remains, bounded by flanks 34, which covers the etching 12. On account of diffraction and reflection phenomena of the UV radiation, the polymerization of the film 30 takes place, parallel to the x-y plane, to a greater extent in the vicinity of the face 11 of die, and to a lesser extent in the vicinity of the surface 35 of the film: the flanks 34 are not therefore parallel to the z axis, but have a taper γ, negative according to the sign convention indicated in FIG. 16.

Figure 17:
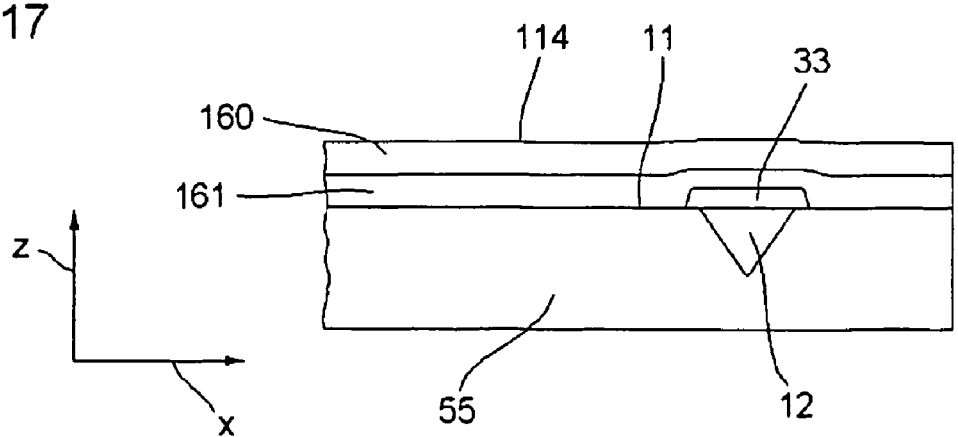
FIG. 17 represents the application of the layers of lift off resist and of positive photoresist.

In a step 171, similar to step 71 already described in relation to the known art, on the dice 55 a layer 161 of lift off resist is applied, for instance of the LOR® series by Micro-Chem, having for example a thickness of between 0.5 and 6 □m, as indicated in the section in FIG. 17. The lift off resist is usually applied in the fluid state, by means for example of the process known as spinner coating.

The taper γ of the covering 33 promotes a better application of the lift off resist, and also a better flattening of it.

In a step 172, similar to the step 72 already described for the known art, on the lift off resist 161 a layer 160 of conventional positive photoresist is applied, having for example a thickness of between 0.5 and 20 □m, as indicated in the same FIG. 17. The positive photoresist is also usually applied in the fluid state, by means for example of spinner coating.

Designated with the numeral 114 is the upper surface of the layer 160 of photoresist, substantially parallel to the face 11 and to the x-y plane.

With this method, thanks to the presence of the covering 33, the upper surface 114 is more regular than the surface 14 in the known art, and therefore permits cavities with controlled dimensions to be made, even in the vicinity of the etchings.

Figure 18:
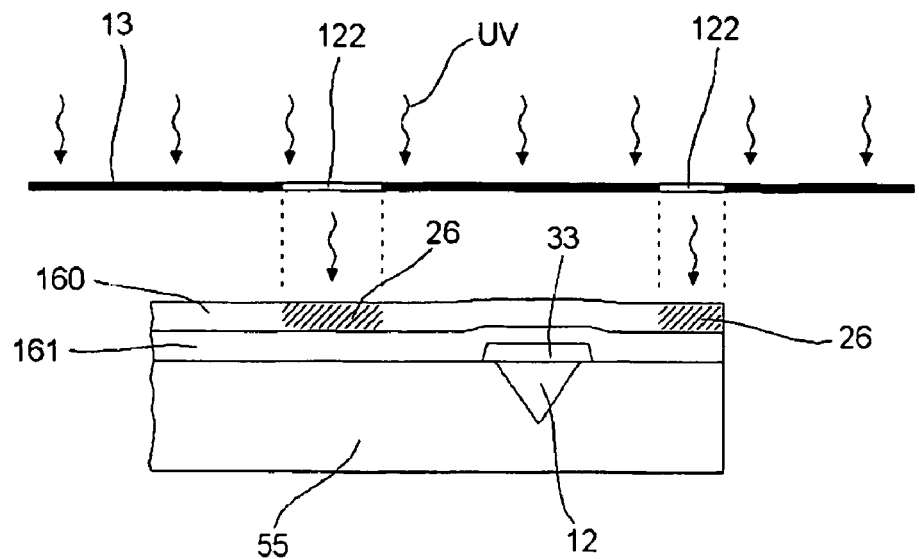
FIG. 18 represents the exposure of the layer of positive photoresist.

In a step 174, similar to the step 74 already described for the known art, the exposure of the positive photoresist to ultraviolet (UV) radiation is performed by means of the mask 13 provided with windows 122 (FIG. 18). The photoresist, being positive, depolymerizes in the zones 26 corresponding to the windows 122, and therefore struck by the UV radiation, whereas it remains insoluble in the zones that are kept in the shade by the opaque areas of the mask.

Figure 19:
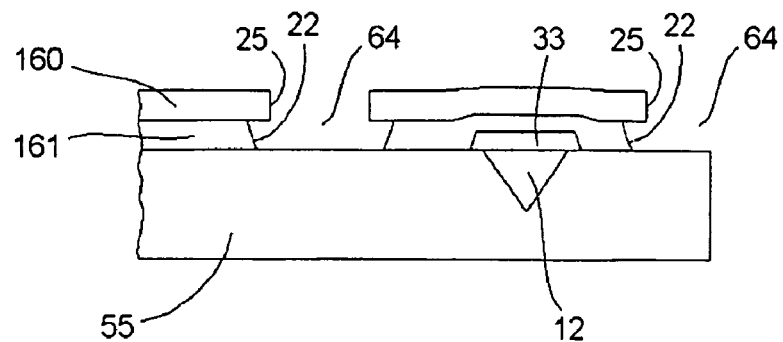
FIG. 19 represents the development of the same layer of photoresist.

In a subsequent step 175, similar to the step 75 already described for the known art (FIG. 19), the layer of photoresist 160 is developed according to known techniques which, by means of a solvent, remove the photoresist only in the zones 26 depolymerized by the ultraviolet (UV) radiation through the windows 122, so that in this way the cavities 64 bound by the edges 25 are made.

The same solvent attacks the underlying lift off resist 161 to a greater extent than the photoresist 160, thus producing the sub-etchings 22.

Figure 20:
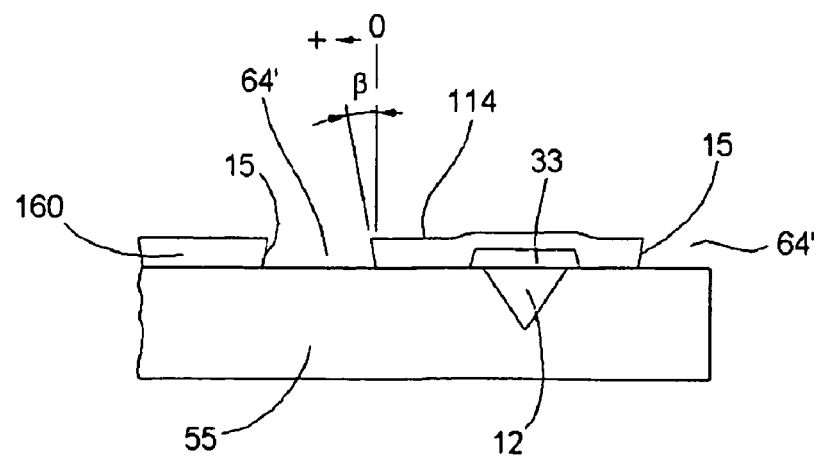
FIG. 20 represents the development of the layer of photoresist in the monolayer technology.

Again in this case, there exists a first monolayer alternative, illustrated in FIG. 20, according to which only the monolayer layer of photoresist 160 is produced. The cavities 64' are in this case bounded by the walls 15 which, on account of the diffraction and reflection phenomena of the UV radiation already mentioned, present an undercut β, which is positive according to the sign convention indicated in FIG. 20.

The second monolayer alternative also exists, again illustrated with the aid of FIG. 20, according to which only the layer of photoresist 160 is produced, which is then treated with a surface modifier, for instance toluene, which renders the upper surface 114 more resistant to the solvent: following development, in the same photoresist 160, walls 15 with sub-etching or with a more accentuated positive undercut β are produced in this way.

Figure 21:
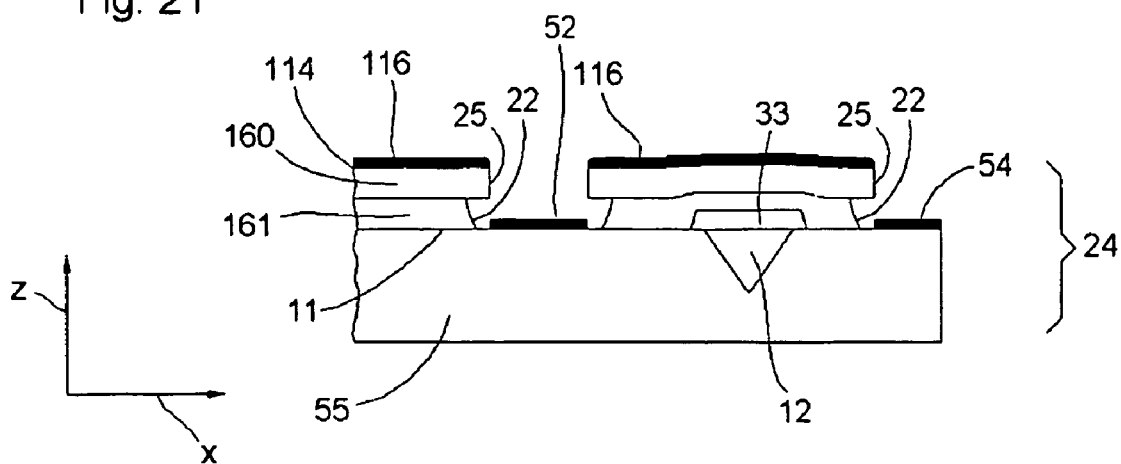
FIG. 21 represents a deposited layer on the layer of photoresist and in the cavities.

In a step 176, illustrated with the aid of FIG. 21 and similar to the step 76 already described for the known art, vacuum depositing is performed, for example of a metal, on the surface 114, where the latter has remained intact, and on the face 11 where the latter has been uncovered through the effect of the development described in step 175. Depositing is performed, for instance, by means of a sputtering or electron beam process, both of which known, the result of which is a subassembly 24, comprising a first deposited layer (52, 54) which assumes the same geometry as the cavities 64 and effectively constitutes the outer pad 52 and the inner pads 54, and a further deposited layer 116 adhering to the surface 114. No layer, on the other hand, is deposited on the sub-etchings 22.

Even if the monolayer technology is chosen, no layer is deposited on the walls 15, thanks to the positive undercut β and the sub-etchings, if any.

The deposited layers 52, 54 and 116 may be metallic, or made of non-metallic materials, such as for example oxides, nitrides, carbides and the like.

If the deposited layers 52, 54 and 116 are made of metals, these may be non-reactive, for example titanium, gold or platinum, in order to produce the outer pads 52 or the inner pads 54, or a gold/tin 80/20 alloy to produce the solderings. These alloys are usually deposited, according to the known technology, in alternate layers of the component metals: the various layers are made with appropriate ratios between the thicknesses to give the alloy—generally eutectic—the right composition, and can assume an overall thickness, for instance, of up to 5 μm.

Figure 22:
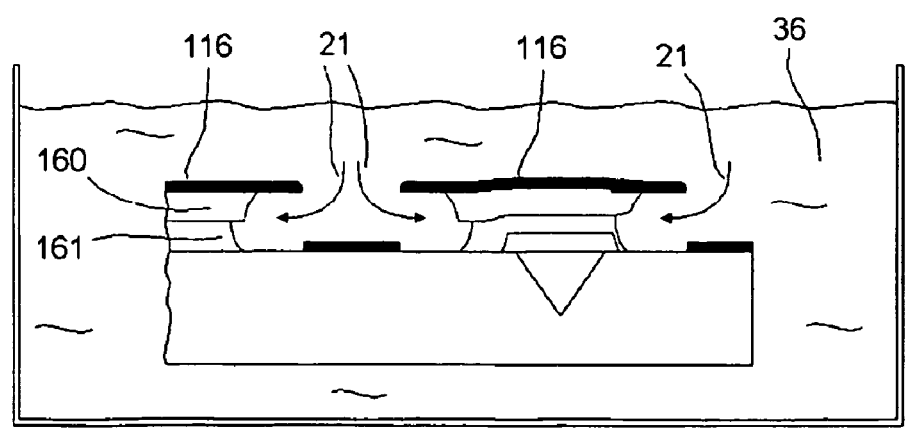
FIG. 22 represents the lift off of the layer of photoresist.

In a step 177, similar to the step 77 already described for the known art and illustrated with the aid of FIG. 22, the layer 160 of positive photoresist and the layer 161 of lift off resist are removed by means of the lift off process. The subassembly 24 is plunged into a solvent 36, for example of acetone or, better, Remover PG by Micro-Chem, which, through the edges 25 and the sub-etchings 22, free of the deposited layer, penetrates through the layers 160 and 161, and dissolves them proceeding in the directions indicated by the arrows 21, eliminating them completely and freeing the further deposited layer 116, which is cast aside. The operation is facilitated by a mechanical action such as, for example, an ultrasound washing.

If the monolayer technology is chosen, this step 177 is carried out in a similar way, since the solvent can penetrate through the walls 15, which are also free of the deposited layer.

In a step 143, the covering 33 of negative photoresist is removed by means of, for example, a known type plasma operation.

Figure 23:
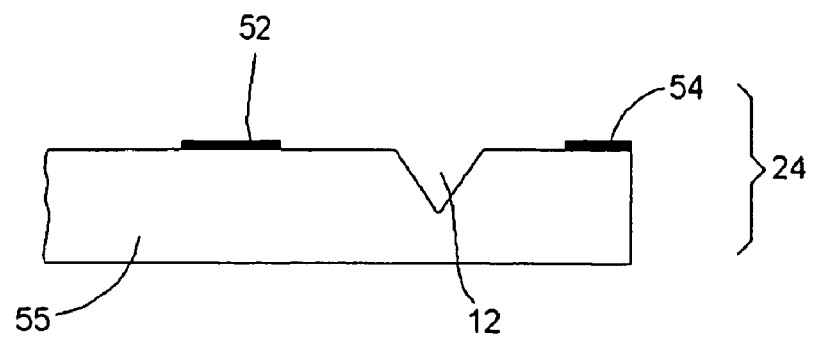
FIG. 23 represents the subassembly at the end of the process described, according to the invention.

At the end of the step 143 the subassembly 24 is finished as shown in FIG. 23, where the die 55, the etching 12, an outer pad 52 and an inner pad 54 can be seen.

The invention claimed is:

1. A method for selectively covering a micro machined surface on a die comprising an upper face and at least one etched recess located in the upper face, the method comprising:
   applying a film of negative photoresist onto the upper face, the film of negative photoresist covering the at least one etched recess without filling the at least one etched recess;
   exposing the film of negative photoresist to ultraviolet radiation through a first mask, the first mask having a window coextensive with at least the at least one etched recess, thereby polymerizing a region of the film of negative photoresist covering the at least one etched recess;
   removing a non-polymerized portion of the film of negative photoresist from the upper face, thereby leaving a covering of polymerized film over the at least one etched recess;
   applying a layer of lift off resist over the upper face of the die and over the covering; and
   applying a layer of positive photoresist over the layer of lift off resist.

2. The method according to claim 1, further comprising:
   exposing a portion of the layer of positive photoresist to ultraviolet radiation through a window in a second mask to depolymerize the portion of the layer of positive photoresist; and
   removing the depolymerized portion of the layer of positive photoresist, thereby forming at least one cavity.

3. The method according to claim 2, further comprising:
   applying a first deposited layer on said upper face of said die;
   applying a further deposited layer on an upper surface of the layer of positive photoresist;
   removing the layer of positive photoresist and the layer of lift off resist using a solvent that acts through side edges and sub-etchings of the at least one cavity;
   casting aside the further deposited layer; and
   removing the film of negative photoresist.

4. The method according to claim 1, wherein the first deposited layer and said further deposited layer are metallic.

5. The method according to claim 4, wherein the first deposited layer and said further deposited layer include at least one layer of gold or of titanium or of platinum.

6. The method according to claim 4, wherein the first deposited layer and said further deposited layer include at least one layer of gold/tin alloy.

7. The method according to claim 1, wherein the further deposited layer and said first deposited layer comprise non metallic material.

8. The method according to claim 7, wherein the nonmetallic materials comprise an oxide.

9. The method according to claim 7, wherein the nonmetallic materials comprise a carbide.

10. The method according to claim 7, wherein the nonmetallic materials comprise a nitride.

11. A method for selectively covering a micro machined surface on a die comprising an upper face and at least one etched recess located in the upper face, the method comprising:
    applying a film of negative photoresist onto the upper face, the film of negative photoresist covering the at least one etched recess without filling the at least one etched recess;
    exposing the film of negative photoresist to ultraviolet radiation through a first mask, the first mask having a window coextensive with at least the at least one etched recess, thereby polymerizing a region of the film of negative photoresist covering the at least one etched recess;
    removing a non-polymerized portion of the film of negative photoresist from the upper face, thereby leaving a covering of polymerized film over the at least one etched recess; and
    applying a layer of positive photoresist over the upper face of the die and over the covering.

12. The method according to claim 11, further comprising:

exposing a portion of the layer of positive photoresist to ultraviolet radiation through a window in a second mask to depolymerize the portion of the layer of positive photoresist; and removing the depolymerized portion of the layer of positive photoresist, thereby forming at least one cavity.

13. The method according to claim 12, further comprising:

applying a first deposited layer on said upper face of said die;

applying a further deposited layer on an upper surface of the layer of positive photoresist;

removing the layer of positive photoresist using a solvent that acts through walls of the at least one cavity;

casting aside the further deposited layer; and removing the film of negative photoresist.

14. The method according to claim 13, wherein the first deposited layer and said further deposited layer are metallic.

15. The method according to claim 14, wherein the first deposited layer and said further deposited layer comprise at least one layer of gold or of titanium or of platinum.

16. The method according to claim 14, wherein the first deposited layer and said further deposited layer comprise at least one layer of gold/tin alloy.

17. The method according to claim 13, wherein the first deposited layer and said further deposited layer are made of nonmetallic materials.

18. The method according to claim 17, wherein the nonmetallic materials comprise an oxide.

19. The method according to claim 17, wherein the nonmetallic materials comprise a carbide.

20. The method according to claim 17, wherein the nonmetallic materials comprise a nitride.

* * * * *